United States Patent
Marszalkowski, Jr.

(10) Patent No.: US 7,322,288 B2
(45) Date of Patent: *Jan. 29, 2008

(54) METHOD AND APPARATUS FOR PERFORMING OPERATIONS WITHIN A STENCIL PRINTER

(75) Inventor: Frank John Marszalkowski, Jr., Cumberland, RI (US)

(73) Assignee: Speedline Technologies, Inc., Franklin, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/594,376

(22) Filed: Nov. 8, 2006

(65) Prior Publication Data

US 2007/0051253 A1 Mar. 8, 2007

Related U.S. Application Data

(63) Continuation of application No. 11/265,018, filed on Nov. 2, 2005, now Pat. No. 7,171,898, which is a continuation of application No. 10/783,123, filed on Feb. 19, 2004, now Pat. No. 7,013,802.

(51) Int. Cl.
*B41M 1/12* (2006.01)

(52) U.S. Cl. ...................................... 101/129
(58) Field of Classification Search ............ None
See application file for complete search history.

(56) References Cited

U.S. PATENT DOCUMENTS

| | | | |
|---|---|---|---|
| 1,901,473 A * | 3/1933 | Respess | 101/123 |
| 3,343,483 A * | 9/1967 | Schueler | 101/114 |
| 3,419,413 A * | 12/1968 | Euforbia | 427/282 |
| 3,777,661 A | 12/1973 | Aiko et al. | |
| 3,874,289 A | 4/1975 | Valentin | |
| 5,060,063 A | 10/1991 | Freeman | |
| RE34,615 E | 5/1994 | Freeman | |
| 5,452,656 A | 9/1995 | Becher et al. | |
| 5,491,871 A | 2/1996 | Reber et al. | |
| 5,724,889 A | 3/1998 | Aun et al. | |
| 5,813,331 A * | 9/1998 | Tan et al. | 101/129 |
| 5,865,117 A | 2/1999 | Asai et al. | |
| 5,882,720 A * | 3/1999 | Legault et al. | 427/8 |
| 5,941,171 A | 8/1999 | Fromm | |
| 5,991,963 A | 11/1999 | Tourigny | |
| 6,217,669 B1 | 4/2001 | Sarashina et al. | |
| 6,237,484 B1 | 5/2001 | Homma et al. | |

(Continued)

OTHER PUBLICATIONS

Patent Abstracts of Japan, JP 2004020984 A (NEC Corp.), Jan. 22, 2004, 1 pg.
International Search Report of PCT/US2005/004695 dated May 24, 2005.

*Primary Examiner*—Anthony Nguyen
(74) *Attorney, Agent, or Firm*—Lowrie, Lando & Anastasi, LLP

(57) ABSTRACT

An apparatus for performing operations on a surface of an electronic substrate comprises a frame, a dispenser, coupled to the frame, to dispense a material onto the electronic substrate, a stencil moveable on a gantry system having at least one aperture to receive the material as the material is dispensed on the substrate, a controller that controls dispensing of the material on the substrate, and a wiper to remove material from the stencil as the stencil is translated away from the electronic substrate by the gantry system.

15 Claims, 3 Drawing Sheets

U.S. PATENT DOCUMENTS

| | | |
|---|---|---|
| 6,324,973 B2 | 12/2001 | Rossmeisl et al. |
| 7,013,802 B2 | 3/2006 | Marszalkowski, Jr. |
| 2001/0017086 A1 | 8/2001 | Takahashi et al. |
| 2002/0019680 A1 | 2/2002 | Nishikawa et al. |
| 2002/0148374 A1 | 10/2002 | Peckham et al. |
| 2003/0021886 A1* | 1/2003 | Baele .......................... 427/8 |

* cited by examiner

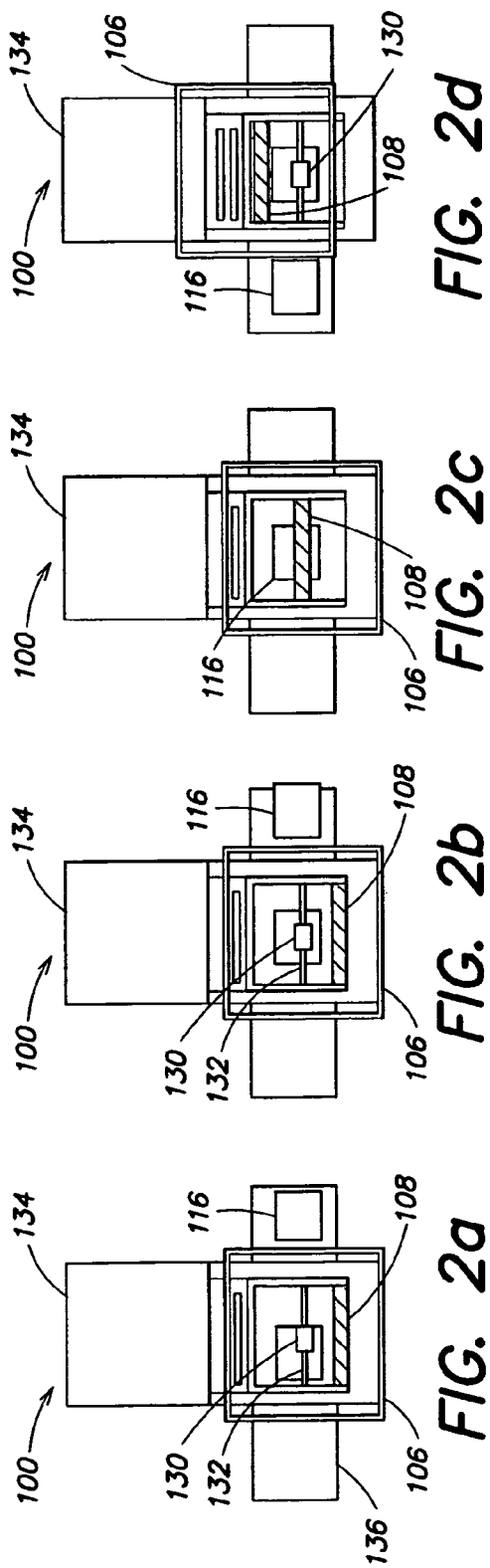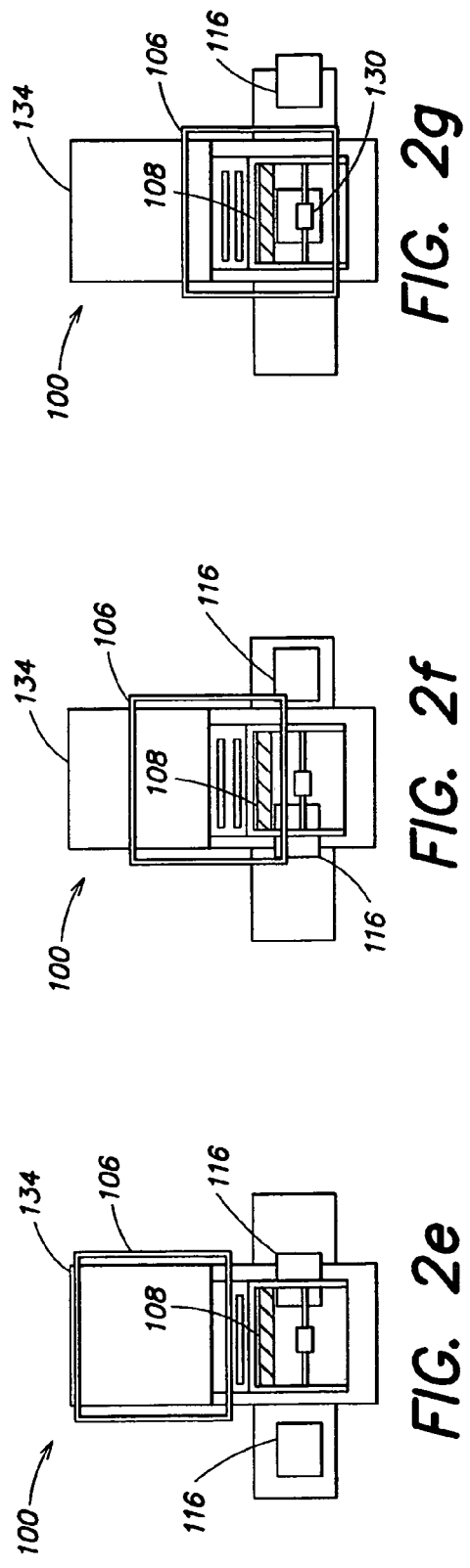

METHOD AND APPARATUS FOR PERFORMING OPERATIONS WITHIN A STENCIL PRINTER

RELATED APPLICATIONS

This application is a continuation of U.S. Ser. No. 11/265,018, filed on Nov. 2, 2005, now U.S. Pat No. 7,171,898 entitled "METHOD AND APPARATUS FOR PERFORMING OPERATIONS WITHIN A STENCIL PRINTER," which is a continuation of U.S. Ser. No. 10/783,123, filed on Feb. 19, 2004, now U.S. Pat. No. 7,013,802 entitled "METHOD AND APPARATUS FOR SIMULTANEOUS INSPECTION AND CLEANING OF A STENCIL," both which are herein incorporated by reference in its entirety.

FIELD OF THE INVENTION

The invention relates to apparatus and methods for screen printing, and more specifically to apparatus and methods for the screen printing of electronic substrates such as circuit board assemblies.

BACKGROUND OF THE INVENTION

The manufacturing of circuit boards involves many processes, one of which is the screen printing of solder paste or other adhesives on the surface of a circuit board so that electronic components can thereafter be deposited onto the board. The boards typically have a pattern of pads or some other conductive surface onto which solder paste will be deposited. To accomplish the deposition of solder paste, a stencil is created that has an aperture or a plurality of apertures defining a pattern to be printed on the surface of the board. The solder paste or other adhesive to be deposited on the board is placed on top of the stencil for deposition into the aperture or apertures. A squeegee or wiper blade is passed over the stencil and forces the solder paste into the apertures. Excess solder paste may then be removed from the top of the stencil so that substantially all of the solder paste that remains is in the aperture or apertures. The stencil is then separated from the board and the adhesion between the board and the solder paste causes most of the material to stay on the board. Material left on the surface of the stencil is removed in a cleaning process before additional circuit boards are printed.

Another process in the printing of circuit boards involves inspection of the boards after solder paste has been deposited on the surface of the boards. Inspecting the boards is important for determining that clean electrical connections can be made. An excess of solder paste can lead to shorts, while too little solder paste in appropriate positions can prevent electrical contact. Generally, a vision inspection system is employed to provide a two-dimensional or a three-dimensional inspection of the solder paste on the board.

The stencil cleaning process and the circuit board inspection process are merely two of a number of processes involved in producing circuit boards. To produce the greatest number of circuit boards of consistent quality, it is often desirable to reduce the cycle time necessary to manufacture circuit boards, while maintaining systems that ensure the quality of the boards produced, such as the board inspection and stencil cleaning systems.

SUMMARY OF THE INVENTION

In general, in one aspect, the invention provides an apparatus for cleaning a surface of a stencil while simultaneously inspecting a solder paste deposits on a circuit board. The simultaneous activities of cleaning and inspecting are accomplished by translating the stencil over a fixed stencil wiper, and with the stencil removed from a position over the surface of the circuit board, a vision inspection system can be moved into position to inspect the board. Alternatively, a vision inspection system can inspect the board while the stencil is in a position over the board. Thus, inspection is possible while the stencil is in place over the board or substantially simultaneously with the wiping of the stencil. Aspects of the invention provide improved efficiency during circuit board production.

Embodiments of the invention provide an apparatus for performing operations on a surface of an electronic substrate. The apparatus includes a frame, a dispenser, coupled to the frame, to dispense a material onto the electronic substrate, a stencil moveable on a gantry system having at least one aperture to receive the material as the material is dispensed on the substrate, a controller that controls dispensing of the material on the substrate, and a wiper to remove material from the stencil as the stencil is translated away from the electronic substrate by the gantry system.

Implementations of the invention can include one or more of the following features. The wiper can be fixed in position. The stencil can be moved on the gantry system over a position of the wiper. The apparatus can further include an inspecting probe coupled to a second gantry system for inspecting a surface of the substrate. The inspecting probe can be moveable to a position over the electronic substrate. The stencil can translate over the fixed wiper substantially simultaneously with the inspection of the electronic substrate.

Embodiments of the invention further provide a method for performing a printing operation on a surface of a substrate. The method includes transporting the substrate into a position for printing a material onto the substrate, aligning the substrate and a stencil, the stencil having at least one aperture to receive the material as the material is deposited onto the substrate, depositing the material through the stencil and onto the substrate, and translating the stencil from a position over the surface of the substrate, over a fixed wiper positioned to remove a residual material from the surface of the stencil as the stencil is translated.

Implementations of the invention may include one or more of the following features. The method may further comprise inspecting the substrate using a video probe inspecting system. The steps of inspecting and translating can occur substantially simultaneously. The method may also comprise transporting a second substrate to a printing position while translating the stencil over the fixed wiper.

A still further embodiment of the present invention comprises a method for simultaneously inspecting an electronic substrate and cleaning a stencil in a stencil printer. The method includes positioning the stencil above the electronic substrate, depositing a material on the electronic substrate, separating the stencil and the electronic substrate, translating the stencil to a position removed from the area over the circuit board, inserting an inspecting system in a space occupying the area from which the stencil was removed, and inspecting the electronic substrate while translating the stencil over a fixed wiper for cleaning.

The invention will be more fully understood after a review of the following figures, detailed description and claims.

BRIEF DESCRIPTION OF THE FIGURES

For a better understanding of the present invention, reference is made to the drawings which are incorporated herein by reference and in which:

FIG. 2a is a top view of the printer of FIG. 1 in a print load phase in one embodiment of the invention;

FIG. 2b is a top view of the printer of FIG. 1 in an align print and exit completed circuit board phase in one embodiment of the invention;

FIG. 2c is a top view of the printer of FIG. 1 in a printing phase in one embodiment of the invention;

FIG. 2d is a top view of the printer of FIG. 1 in a stencil wipe and inspect phase in one embodiment of the invention;

FIG. 2e is a top view of the printer of FIG. 1 in a complete wipe and exit phase in one embodiment of the invention;

FIG. 2f is a top view of the printer of FIG. 1 in a wipe and load print phase in one embodiment of the invention;

FIG. 2g is a top view of the printer of FIG. 1 wipe and align print phase for a second circuit board in one embodiment of the invention.

DETAILED DESCRIPTION OF PREFERRED EMBODIMENTS

Embodiments of the present invention are described below with reference to screen printers or stencil printers used to produce printed circuit boards. As understood by those skilled in the art, embodiments of the present invention can be used with electronic substrates other than circuit boards, such as electronic components, and with machines other than screen printers such as pick and place machines or dispensing machines.

Figure 1:
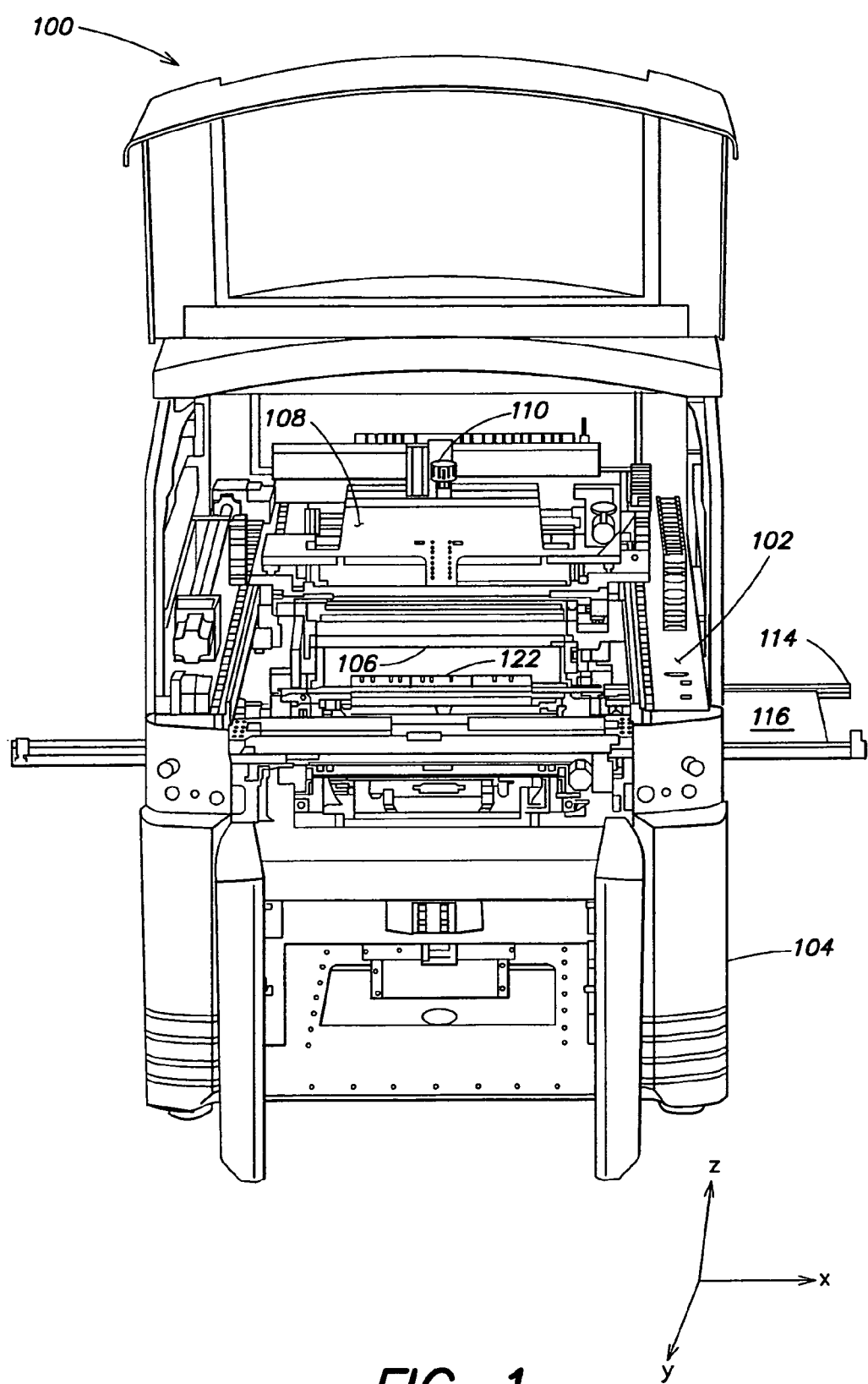
FIG. 1 is a perspective drawing of a screen printer in one embodiment of the invention.

Referring to FIG. 1, a printer 100 in accordance with one embodiment of the invention that applies solder paste or other materials to substrates, such as circuit boards, is shown. The printer is an improvement over the screen printers described in U.S. Pat. No. 6,324,973, which is hereby incorporated by reference.

As shown in FIG. 1, the printer 100 includes a frame 102, a controller 104, a stencil 106, solder paste cartridges 110, a dispensing head/squeegee 108, a board support mechanism 122, a tractor feed mechanism 114 and a circuit board 116. The circuit board enters the printer 100 on the tractor feed mechanism 114. The stencil 106 is attached fixedly to the frame 102 in a position above the position in which the circuit board 116 will enter the printer on the tractor feed mechanism 114. The dispenser head/squeegee 108 is in proximity to the solder paste cartridges 110 and is attached to the printer 100 in a position above the solder stencil 106. The solder stencil 106 has apertures through which solder is deposited on the surface of a circuit board. The controller 104 is internal to the mechanisms of the printer 100. The controller is configured to receive signals from operations in the printer, such as alignment of the board, movement of the stencil, and deposit of the solder paste, and control the printer accordingly.

Circuit boards 116 fed into the printer 100 typically have a pattern of pads or other, usually conductive surface areas onto which solder paste will be deposited. When directed by the controller of the printer, the tractor feed mechanism 114 supplies boards to a location over the board support mechanism and under the stencil 106. Once arriving at the position under the stencil 106, the circuit board 116 is in place for a manufacturing operation. To successfully deposit solder paste on the circuit board 116, the circuit board 116 and the stencil 106 are aligned, via the controller. Alignment is accomplished by moving the stencil or circuit board based on readings from the vision inspection system, discussed below. When the solder stencil 106 and the circuit board 116 are aligned correctly, the stencil is lowered toward the board 116 for application of the solder paste through the apertures, or the circuit board can be raised toward the stencil by the support mechanism 122.

The pattern of the apertures on the stencil corresponds to the pattern of conductive surfaces or pads already on the circuit board 116. The dispenser head/squeegee 108, positioned above the stencil 106, can vary the amount of solder paste delivered on the stencil 106 and applied by the squeegee. The squeegee 108 wipes across the stencil, thereby pushing solder paste into the stencil apertures and onto the board 116. Solder paste remains on the circuit board 116 in the preset pattern when the support mechanism supporting the board moves downward away from the position of the stencil, or the stencil moves upward away from the board, under control of the controller. The surface tension between the circuit board 116 and the solder paste causes most of the solder paste to remain on the circuit board when the circuit board 116 and the stencil 106 are separated. A vision inspection system then moves into position over the circuit board 116 to inspect the solder paste deposits to determine whether the solder paste has been accurately placed on the circuit board. Inspection aids in ensuring that the proper amount of material has been deposited and that the material has been deposited at the proper locations on the circuit board. The vision inspection system can use fiducials, chips, board apertures, chip edges, or other recognizable patterns on the circuit board to determine proper alignment. After inspection of the circuit board, the controller controls movement of the circuit board 116 to the next location using the tractor feed mechanism, where electrical components will be placed on the circuit board 116.

In addition to vision inspection of the circuit board upon completion of the deposition of solder paste onto the circuit board, in one embodiment of the invention, the stencil is cleaned using a wiper to remove excess solder paste from the surface of the stencil prior to beginning a print cycle on a next circuit board. Generally, in known printers, the wiper used to clean the stencil moves over the surface of the stencil after printing has occurred. Removal of excess solder paste can occur after each print cycle, or after a number of print cycles when it has been determined that a substantial amount of solder paste is on the surface of the stencil and should be removed. Additionally, before the circuit board can move to a next print operation in the printer or otherwise, the circuit board is inspected to determine the accuracy with which solder paste has been deposited on the surface of the circuit board.

To accomplish improvements and efficiency in the print cycle, the board inspection process and the stencil cleaning process occur substantially in parallel. During the inspection of at least one of the printed boards, the stencil is moved to a position where a stencil wipe process occurs.

Referring to FIGS. 2a-2g, like numbers referring to like elements, in each of the FIGS. 2a-2g, as each represents a printer in a different phase of printing. In FIGS. 2a-2g, the printer of FIG. 1 is shown in a series of top perspectives. In FIGS. 2a-2g, the wiper remains fixed in position while the stencil is in motion. In FIGS. 2a-2g, the printer 100 includes the stencil 106, the squeegee 108, the circuit board 116, a vision probe 130, a vision gantry 132, and a fixed wiper 134. The vision probe 130 is coupled to the vision gantry 132, which is coupled to the frame of the printer 100. The vision probe 130 is located between the stencil 106 and the circuit board 116. The vision probe 130 moves into position over the circuit board 116 via a vision gantry system. The squeegee 108 is coupled to the frame in a position above the stencil 106.

In FIG. 2a, the circuit board 116 is loaded into the printer 100. In FIG. 2b, the circuit board 116 and the stencil 106 are aligned. Alignment of the stencil 106 and the circuit board 116 is accomplished by using the vision probe 130. The vision probe can be, for example, the vision probe discussed in U.S. Pat. No. 5,060,063, entitled, "Viewing and illuminating video probe with viewing means for simultaneously viewing object and device images along viewing axis and translating them along optical axis," which is assigned to the assignee of the present invention and is herein incorporated by reference. Also incorporated by reference in its entirety is U.S. Pat. No. RE35,615 entitled, "Video Probe Aligning of Object to be Acted Upon," which further discusses aspects of the vision probe of the present invention. Once aligned, the vision probe 130 is moved from its position to a resting position via the vision gantry 132, and the circuit board 116 and the stencil 106 come into contact, or substantially close proximity for printing, as shown in FIG. 2c. Printing of solder paste occurs as the squeegee 108 translates over the surface of the stencil 106 and deposits solder paste through the apertures of the stencil 106, onto the circuit board 116. The squeegee 108 can make a full forward sweep and come to a resting position in preparation for a next circuit board 116. Alternatively, the squeegee 108 can deposit solder paste on the circuit board and return to its starting position.

With solder paste deposited on the surface of the circuit board 116, the circuit board 116 separates from the stencil 106 by dropping away from the surface of the stencil, shown in FIG. 2d. Alternatively, the stencil can be moved upward away from the surface of the circuit board 116. Having completed printing, the stencil translates, for example toward the back of the printer 100, to be cleaned. While in most known systems the stencil is fixed in position, in the present printer 100, the stencil can move in a forward and backward motion. The stencil is cleaned by moving from front to back over the surface of the wiper 134, as the wiper contacts the surface of the stencil and removes excess solder paste. The stencil moves to the back and over the surface of the wiper by moving backward in the printer 100, i.e., in the negative Y axis direction, and the stencil moves back into position by moving forward in the positive Y axis direction. This motion is the translation of the stencil, although it is possible that translation of the stencil in the printer 100 may occur in the X axis direction alternatively or additionally. The wiper 134 may be fixed in position to a side of the track 136, which is the track along which the circuit board is transported. The wiper 134 generally contacts the bottom or undersurface of the stencil where deposits of material may become built up. Preferably, the wiper 134 is positioned toward the rear of the printer 100 so as not to interfere with the operation of the stencil and vision system. The stencil 106 is positioned at a level above the wiper 134. As the stencil translates rearward, the wiper 134 cleans the surface of the stencil by contacting the stencil while the stencil travels over the wiper and removes the residual solder paste.

Figure 3:
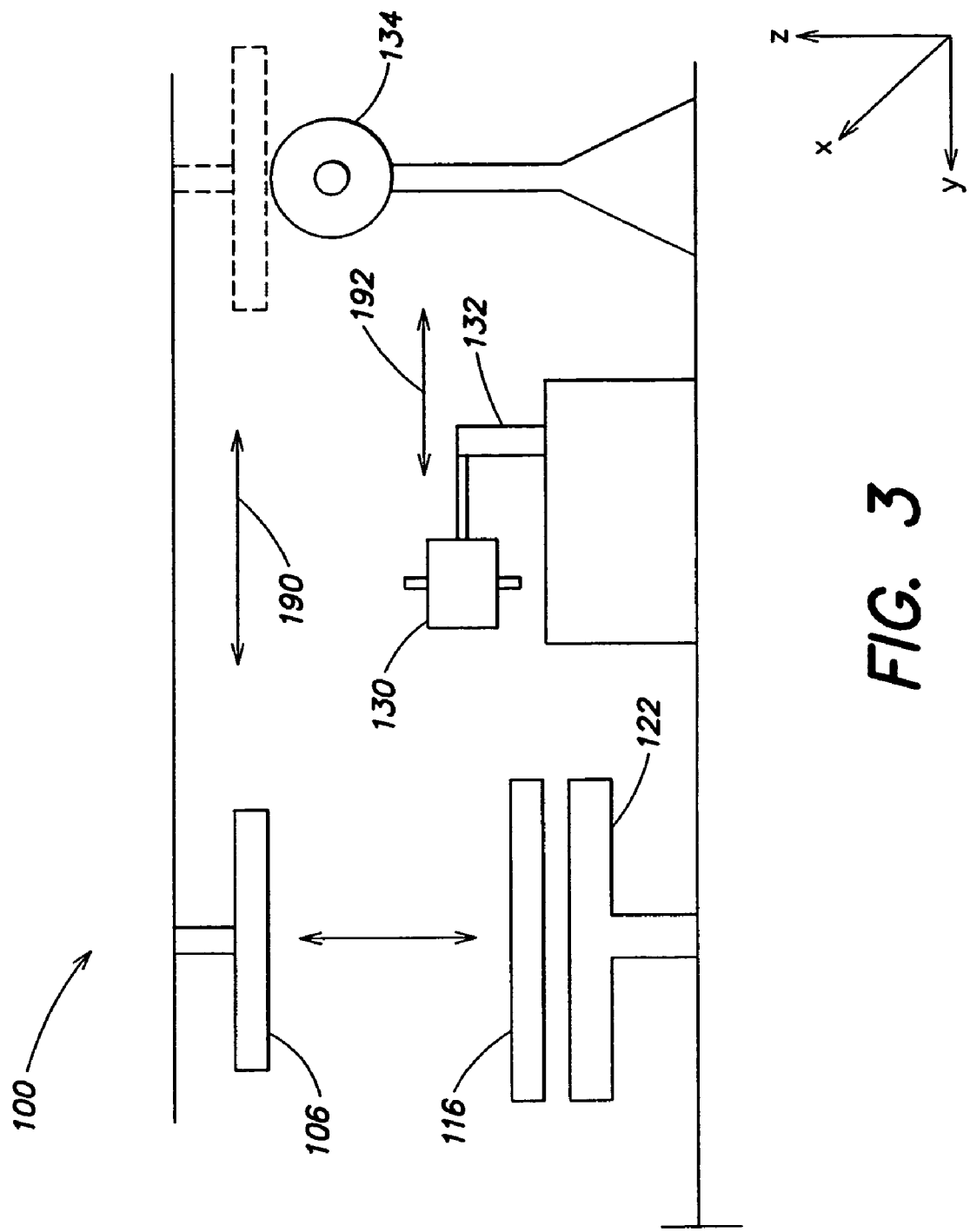
FIG. 3 is a side view of a portion of the printer of FIG. 1 according to one embodiment of the invention.

Referring to FIG. 3, a side view of the process described in FIG. 2a-2g is shown. From this view, it is more clearly shown that the stencil 106 moves in a forward and backward direction indicated by arrow 190. As the stencil 106 moves from the first position over the circuit board 116, it contacts the fixed wiper 134, leaving a substantial space over the position of the circuit board 116. Thus, the stencil can move in a first direction that is substantially perpendicular to the position of the circuit board, and in a second planar position substantially parallel to the position of the circuit board.

With continued reference to FIG. 3, and referring again to FIG. 2d, during the time in which the stencil is cleaned by the wiper 134, or substantially simultaneously, the vision probe 130 moves into a position over the surface of the circuit board 116 to perform an inspection task. The vision probe moves in a forward and back motion as indicated by arrow 192. The vision probe 130 is restricted in its movements to a position over the circuit board while the stencil is being cleaned, since the stencil is moved toward the rear of the printer 100, allowing a substantial space over the circuit board for the vision probe 130 to inspect. Thus, wiping of the stencil and inspection of the circuit board may be accomplished in parallel. However, it may not be necessary to clean the stencil after each print cycle, so inspection can occur independently of the cleaning of the stencil.

Referring to FIG. 2e, upon completion of inspection, the circuit board 116 exits the printer 100. The circuit board 116 can exit the printer while the stencil continues to be cleaned. The printing of a first circuit board 116 is thereby completed, and the circuit board can continue to a next manufacturing cycle. The printer 100 is prepared to accept a new circuit board 116 via tracks 136, as is shown in FIG. 2f, and a next print cycle can begin.

While the next circuit board 116 moves into position in the printer, the stencil wipe process is completed and the stencil 106 moves towards the front of the printer 100 to begin the printing cycle for the new circuit board, as is shown in FIG. 2g.

The process of printing a circuit board including stencil wipe and circuit board inspection as depicted in FIGS. 2a-2g can be repeated any number of times to correspond to the number of boards in need of the printing of solder paste. The process may be required at the completion of the printing of a single circuit board 116, or it may be completed after a predetermined number of circuit boards 116 are printed, as inspection and cleaning may not be necessary after each print cycle.

Due to the relative positioning of the stencil and the vision probe, and the ability of the stencil to translate toward the back of the printer, substantially simultaneous operations can occur, thereby reducing the cycle time necessary to complete the printing operation. In addition to improving the cycle time, quality is not compromised, as the circuit boards continue to be inspected. For example, in some printing cycles, a typical inspection task may take from 20 to 60 seconds to accomplish. Wiping of the stencil may occur over a duration of 40 to 60 seconds, depending on the type of wipe process in use. Therefore, with the inspection and the stencil wipe working in parallel, both processes may be completed in one minute or less, saving on the order of ½ to 1 minute in cycle time. These cycle periods are exemplary only and may vary depending on the print cycle characteristics for each machine or product.

Embodiments of the invention describe a fixed wiper positioned below the stencil that cleans the bottom surface of a stencil when the stencil is translated over the wiper blade. In other embodiments of the invention, a wiper is fixed above the surface of the stencil to likewise clean the top surface of the stencil. In still further embodiments of the present invention, the stencil translates to a position over the wiper, and the wiper translates orthogonal to the motion of the stencil when the stencil has moved to be positioned over the wiper. In still further embodiments of the invention, more than one wiper is fixed in a position below the stencil for cleaning. Other positions of the wiper in relation to the stencil are envisioned.

In embodiments of the invention, the vision inspection probe moves on a gantry system to inspect the board after deposition has occurred. In other embodiments of the invention, after inspection of the first board, a second board loaded into position for printing can be properly aligned using the vision system, while the stencil continues to be cleaned.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. A method for loading an electronic substrate on a support mechanism and cleaning a stencil in a stencil printer, the method comprising:
    loading a first electronic substrate on the support mechanism along a first axis;
    positioning the stencil above the first electronic substrate;
    depositing a material on the first electronic substrate;
    separating the stencil and the first electronic substrate;
    moving the stencil from a first position in which the stencil is disposed above the first electronic substrate to a second position translated away from the support mechanism along a second axis that is perpendicular to the first axis, the movement of the stencil between its first and second positions being achieved by means of a stencil movement mechanism and along a common plane;
    selectively performing a procedure on the stencil when moving the stencil;
    unloading the first electronic substrate from the support mechanism;
    loading and aligning a second electronic substrate on the support mechanism while moving the stencil.

2. The method of claim 1, wherein moving the stencil, unloading the first electronic substrate and loading and aligning the second electronic substrate occur substantially simultaneously.

3. The method of claim 1, further comprising inspecting the first electronic substrate when the first electronic substrate is on the support mechanism.

4. The method of claim 3, wherein inspecting the first electronic substrate and moving the stencil occur substantially simultaneously.

5. A method for aligning an electronic substrate while translating a stencil, the method comprising:
    translating the stencil by means of a stencil movement mechanism along a first axis from a first position to a second position, wherein the movement of the stencil from the first position to the second position with the stencil movement mechanism is achieved along a common plane;
    unloading a first electronic substrate;
    transporting a second electronic substrate by means of a tractor feed mechanism along a second axis perpendicular to the first axis to a print position;
    aligning the second electronic substrate when translating the stencil;
    translating the stencil to its first position selectively performing a procedure on the stencil when translating the stencil; and printing solder paste on the second electronic substrate when the stencil is in its first position.

6. The method of claim 5, wherein selectively performing a procedure on the stencil comprises performing a stencil wipe operation.

7. A method for loading an electronic substrate on a support mechanism and cleaning a stencil in a stencil printer, the method comprising:
    loading a first electronic substrate along a first axis on the support mechanism;
    positioning the stencil above the first electronic substrate;
    depositing a material on the first electronic substrate;
    separating the stencil and the first electronic substrate;
    moving the stencil along a second axis perpendicular to the first axis by means of a stencil movement mechanism from a first position over the first electronic substrate to a second position removed from the support mechanism, wherein the movement of the stencil from the first position to the second position with the stencil movement mechanism is achieved along a common plane;
    unloading the first electronic substrate from the support mechanism;
    loading and aligning a second electronic substrate on the support mechanism while moving the stencil; and
    selectively cleaning the stencil when moving the stencil to its second position.

8. The method of claim 7, wherein selectively cleaning the stencil comprises performing a stencil wipe operation.

9. A method for loading and aligning an electronic substrate while translating a stencil, the method comprising:
    translating the stencil by means of a stencil movement mechanism along a first axis from a first position above the electronic substrate to a second position remote from the first position along a common plane;
    selectively performing a procedure on the stencil when translating the stencil;
    unloading a first electronic substrate along a second axis perpendicular to the first axis when translating the stencil to its second position;
    translating the stencil to its first position; and
    loading and aligning a second electronic substrate along the second axis when translating the stencil to its first position.

10. The method of claim 9, further comprising printing solder paste on the second electronic substrate when the stencil is in its first position.

11. The method of claim 9, wherein selectively performing a procedure on the stencil comprises performing a stencil wipe operation.

12. The method of claim 9, further comprising inspecting the electronic substrate when translating the stencil to its second position.

13. The method of claim 12, wherein inspecting the electronic substrate comprises inserting an inspection system above the electronic substrate.

14. The method of claim 9, further comprising separating the stencil and the electronic substrate prior to translating the stencil to its second position.

15. The method of claim 14, wherein separating the stencil and the electronic substrate comprises lowering the electronic substrate away from the stencil.

* * * * *